(12) United States Patent
Hiroshima

(10) Patent No.: US 10,446,295 B2
(45) Date of Patent: Oct. 15, 2019

(54) CHIP RESISTOR AND METHOD FOR PRODUCING THE SAME

(71) Applicant: KOA CORPORATION, Ina-shi, Nagano (JP)

(72) Inventor: Yasushi Hiroshima, Nagano (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 16/072,318

(22) PCT Filed: Jan. 23, 2017

(86) PCT No.: PCT/JP2017/002050
§ 371 (c)(1),
(2) Date: Jul. 24, 2018

(87) PCT Pub. No.: WO2017/130876
PCT Pub. Date: Aug. 3, 2017

(65) Prior Publication Data
US 2019/0035520 A1 Jan. 31, 2019

(30) Foreign Application Priority Data

Jan. 27, 2016 (JP) ................. 2016-013252

(51) Int. Cl.
*H01C 1/028* (2006.01)
*H01C 1/032* (2006.01)
(Continued)

(52) U.S. Cl.
CPC ......... *H01C 1/028* (2013.01); *C23C 14/0652* (2013.01); *C23C 16/402* (2013.01); *H01C 1/032* (2013.01); *H01C 1/14* (2013.01); *H01C 7/006* (2013.01); *H01C 17/02* (2013.01); *H01C 17/12* (2013.01); *H01C 17/16* (2013.01);
(Continued)

(58) Field of Classification Search
CPC .......... H01C 1/028; H01C 17/02; H01C 1/14; H01C 17/12; H01C 7/006; H01C 17/16; H01C 1/032; H01C 7/023; C23C 16/402; C23C 14/065; H01L 28/24; H01L 23/522; B23K 26/382
See application file for complete search history.

(56) References Cited

U.S. PATENT DOCUMENTS 9,336,931 B2 * 5/2016 Tsai ................. H01C 1/142
2009/0302993 A1 12/2009 Fujiwara et al.
2012/0107993 A1 5/2012 Karlin et al.

FOREIGN PATENT DOCUMENTS

JP 2002-141201 5/2002
JP 2004-140285 5/2004
(Continued)

*Primary Examiner* — William Coleman
(74) *Attorney, Agent, or Firm* — Brinks Gilson & Lione

(57) ABSTRACT

Provided is a thin-film chip resistor including an insulating substrate; a thin-film resistive element formed on the substrate; a pair of electrodes connected to the thin-film resistive element; and a protective film covering at least the thin-film resistive element between the pair of electrodes, in which the protective film includes a first protective film and a second protective film, the first protective film containing silicon nitride in contact with the thin-film resistive element, and the second protective film containing silicon oxide in contact with the first protective film.

8 Claims, 13 Drawing Sheets

(51) Int. Cl.
   *C23C 14/06*   (2006.01)
   *C23C 16/40*   (2006.01)
   *H01C 7/00*    (2006.01)
   *H01C 17/12*   (2006.01)
   *H01C 17/16*   (2006.01)
   *H01L 23/522*  (2006.01)
   *H01L 49/02*   (2006.01)
   *H01C 1/14*    (2006.01)
   *H01C 17/02*   (2006.01)
   *B23K 26/382*  (2014.01)
   *H01C 7/02*    (2006.01)

(52) U.S. Cl.
   CPC .......... *H01L 23/5228* (2013.01); *H01L 28/24* (2013.01); *B23K 26/382* (2015.10); *H01C 7/023* (2013.01)

(56) References Cited

FOREIGN PATENT DOCUMENTS

| | | |
|---|---|---|
| JP | 2009-302082 | 12/2009 |
| JP | 2012-096350 | 5/2012 |
| JP | 2015-153814 | 8/2015 |

* cited by examiner

CHIP RESISTOR AND METHOD FOR PRODUCING THE SAME

RELATED APPLICATIONS

This application is a 371 application of PCT/2017/002050 having an international filing date of Jan. 23, 2017, which claims priority to JP2016-013252 filed Jan. 27, 2016, the entire content of each of which is incorporated herein by reference.

TECHNICAL FIELD

The present invention relates to a chip resistor and a method for producing the same.

BACKGROUND ART

Conventionally, thin-film chip resistors having resistive elements made of metal thin films have been widely used. A thin-film resistive element used for a thin-film chip resistor is obtained by forming a resistive film through deposition of metal layers of chromium (Cr) and silicon (Si), or nickel (Ni) and chromium (Cr), for example, on a ceramic substrate and alloying them using sputtering or vacuum deposition, and then patterning the film into a desired shape using photolithography or the like. Typically, high-precision chip resistors can be realized using a thin-film technology.

As an example of producing a resistive thin film with high resistivity, there is disclosed a method of sputtering a target containing silicon and also containing transition metal, such as chromium, therein, in a nitrogen-containing gas so as to deposit them on a substrate (see Patent Literature 1). The deposited resistive thin film is patterned into a shape with an approximately desired resistance value using photolithography or the like, which is then subjected to heat treatment under an inert gas atmosphere, such as nitrogen or argon. Optimally setting the heat treatment conditions therefor can suppress the temperature coefficient of resistance (TCR) to a small value of less than or equal to ±25 ppm/° C.

After that, a resist material for forming electrodes on the thin-film resistive pattern is applied to the substrate and the resulting resist film is patterned, and then, copper or the like is deposited as a material of the electrodes of the resistor using sputtering or the like. Then, the resist and copper are partially removed using a lift-off method so that copper electrodes are formed through patterning.

After the electrodes are formed through a patterning process, a silicon oxide film is deposited as a protective film using plasma CVD or the like. Then, the silicon oxide film is patterned through photolithography and etching steps, so that the silicon oxide film in the electrode regions is removed and openings for contact are formed.

Then, an overcoat film that uses resin paste or the like is applied using screen printing or the like, which is then cured. After that, primary heat treatment and a primary breaking process; formation of end-face electrodes; secondary heat treatment and a secondary breaking process; and the like are performed so as to obtain individual chips. Then, the electrodes are plated, for example, to complete a thin-film resistor. For the overcoat film, a resin material is preferably used.

In addition, regarding a thin-film resistor that uses metal oxide, there is disclosed a method of depositing insulating metal oxide with high resistivity on the surface of the thin-film resistor (see Patent Literature 1). Similarly, regarding a thin-film resistor that uses metal nitride such as the one described above, there is also known a method of depositing insulating metal nitride with high resistivity on the surface of the thin-film resistor.

CITATION LIST

Patent Literature

[Patent Literature 1] JP 2002-141201 A

SUMMARY OF INVENTION

Technical Problem

However, when current is conducted through a thin-film resistor produced using the method of Patent Literature 1 under a high-temperature and high-humidity environment for a long time in order to study the feasibility of the resistor, a phenomenon of an increased resistance value may occur. It has been confirmed through analysis of thin-film resistors with increased resistance values that abnormality occurs in part of a resistive thin film. Such abnormality occurs due to a phenomenon called electrolytic corrosion, which indicates that the resistive thin film conducting current therethrough has been oxidized due to moisture that has intruded into the thin-film resistor.

Resistive thin films that are frequently used are films with relatively low crystallinity, and thus contain many crystal defects, such as dangling bonds. In particular, such resistive thin film also contains many defects on its surface, and such surface is speculated to be active. Thus, if moisture intrudes in a region around such resistive thin film, which is conducting current therethrough, the resistive thin film will be easily oxidized, which can result in an increased resistance value, and ultimately, the film will be an insulating state.

It is an object of the present invention to provide a technique for suppressing changes in the resistance value of a chip resistor with time.

Solution to Problem

According to an aspect of the present invention, there is provided a thin-film chip resistor including an insulating substrate; a thin-film resistive element formed on the substrate; a pair of electrodes connected to the thin-film resistive element; and a protective film covering at least the thin-film resistive element between the pair of electrodes, in which the protective film includes a first protective film and a second protective film, the first protective film containing silicon nitride in contact with the thin-film resistive element, and the second protective film containing silicon oxide in contact with the first protective film.

The thin-film resistive element, which is made of a thin-film resistive material containing one or more types of transition metal, such as chromium, and containing silicon nitride as a main component, for example, has a stacked film of a silicon nitride film and a silicon oxide film as protective films. Since the silicon nitride film has a low diffusion coefficient of moisture, even when a slight amount of moisture intrudes into the thin-film resistor from the outside after the completion thereof, reactions (electrolytic corrosion) between the thin-film resistive material and the moisture can be suppressed. Therefore, fluctuation of the resistance value becomes small. Thus, the thin-film resistor has high moisture resistance.

The refractive index of the first protective film is preferably 2.0 to 2.3 at a wavelength of 632.8 nm. A silicon nitride film with a refractive index of less than 2.0 would have insufficient moisture resistance. The first protective film preferably contains an excessive amount of silicon, the amount being greater than an amount corresponding to the stoichiometric composition of silicon nitride Si:N=3:4. It should be noted that the aforementioned refractive index is a value at a wavelength of 632.8 nm.

In addition, the second protective film is preferably thicker than the first protective film. Further, the thickness of the first protective film is preferably 75 to 500 nm. If the film thickness is less than 75 nm, moisture resistance would be insufficient.

The thin-film chip resistor may further include an overcoat film covering a region between the pair of electrodes, and the overcoat film may be formed covering an opening that is formed in part of the thin-film resistive element.

According to another aspect of the present invention, there is provided a method for producing a thin-film chip resistor, including preparing an insulating substrate; forming, on the substrate, a thin-film resistive element and a pair of electrodes connected to the thin-film resistive element, and forming a first protective film containing silicon nitride, the first protective film covering the thin-film resistive element between the pair of electrodes; and forming a second protective film containing silicon oxide, the second protective film covering the first protective film.

The method may further include, after forming the second protective film, forming an opening by removing part of a region of the thin-film resistive element and at least part of the first protective film and the second protective film that are formed above the part of the region.

The present specification incorporates the disclosure of JP Patent Application No. 2016-013252 that forms the basis of the priority claim of the present application.

Advantageous Effects of Invention

According to the present invention, changes with time of the resistance value of a chip resistor having a thin-film resistive element can be suppressed.

BRIEF DESCRIPTION OF DRAWINGS

FIGS. 6C, 6D and 6E-1 are perspective views illustrating an exemplary method for producing a thin-film resistor in accordance with the first embodiment of the present invention, continued from FIGS. 5A-1, 5A-2 and 5B.

FIGS. 7E-2, 7F and 7G are perspective views illustrating an exemplary method for producing a thin-film resistor in accordance with the first embodiment of the present invention, continued from FIGS. 6C, 6D and 6E-1.

FIG. 12A is a chart illustrating the dependence on the refractive index of a protective film, and FIG. 12B is a chart illustrating the dependence on the film thickness (t) of a first protective film.

FIG. 13 is a chart illustrating the refractive index of a first protective film measured with an optical measurement method using an ellipsometer or the like.

DESCRIPTION OF EMBODIMENTS

Hereinafter, a chip resistor that uses a metal-thin-film resistive element (hereinafter exemplarily referred to as a "thin-film resistor") and a production method therefor in accordance with an embodiment of the present invention will be described in detail with reference to the drawings.

First Embodiment

Figure 4H:
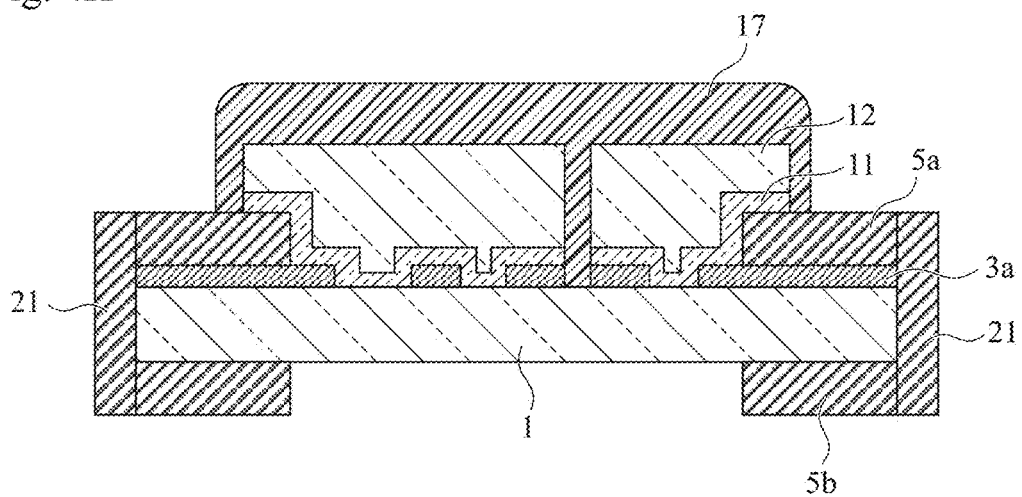
FIGS. 4H-4I are cross-sectional views illustrating an exemplary method for producing a thin-film resistor in accordance with the first embodiment of the present invention, continued from FIGS. 3F-3G.
Figure 4I:
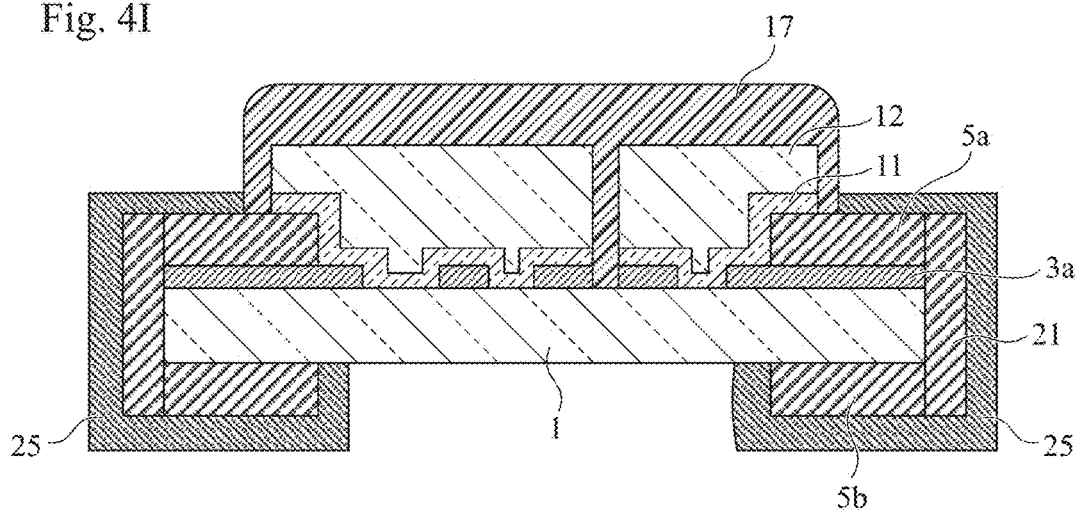
Figures 1, 5A:
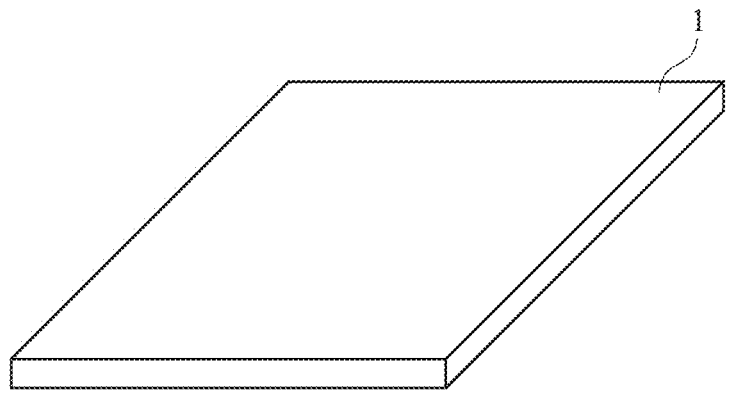
FIGS. 5A-1, 5A-2 and 5B are perspective views illustrating an exemplary method for producing a thin-film resistor in accordance with the first embodiment of the present invention.
Figures 2, 5A:
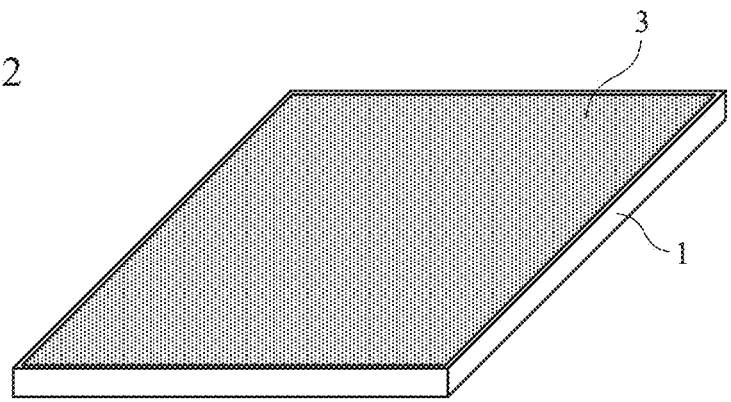
Figure 6C:
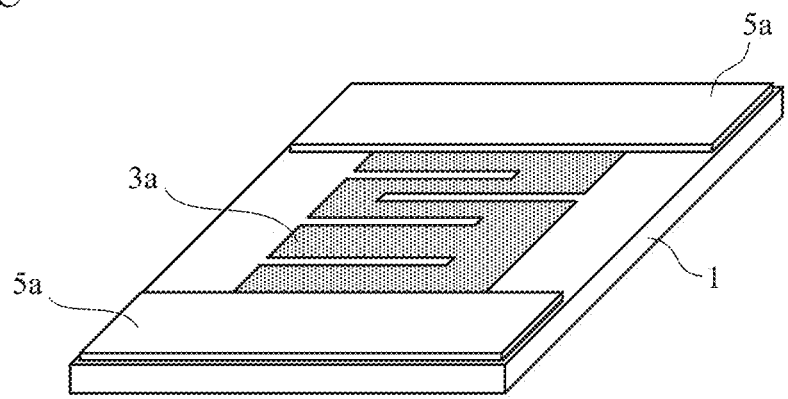
Figures 2, 7E:
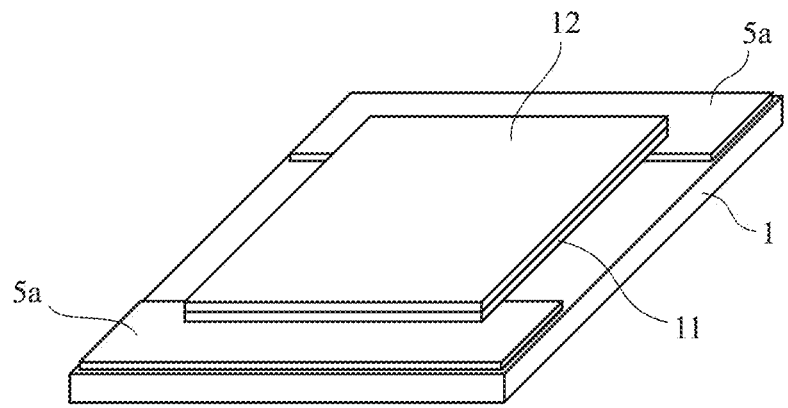
Figure 7F:
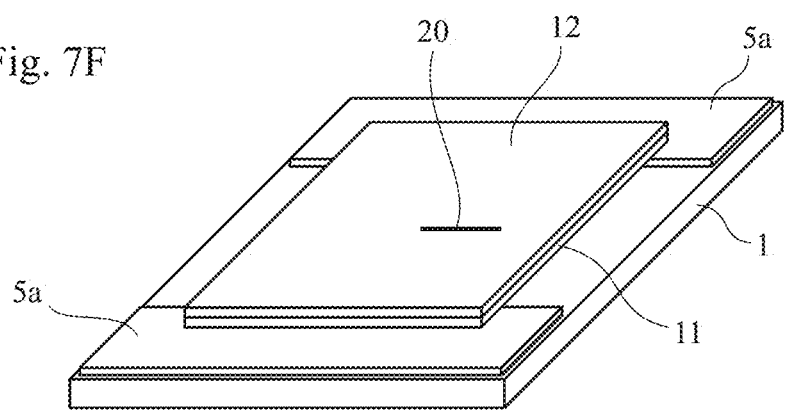
Figure 7G:
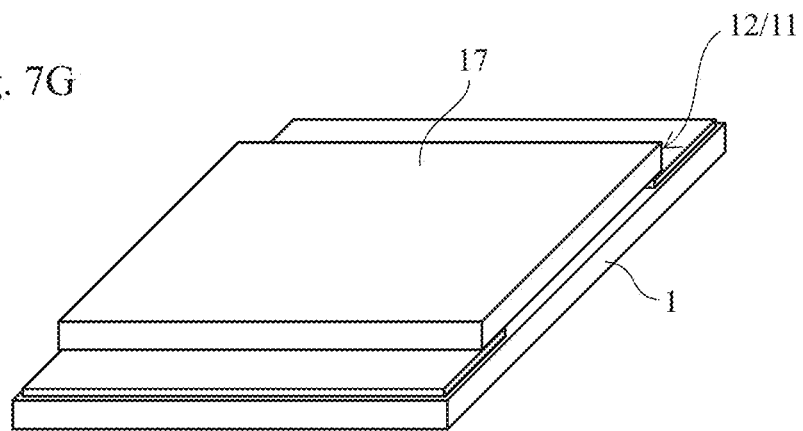
Figure 8:
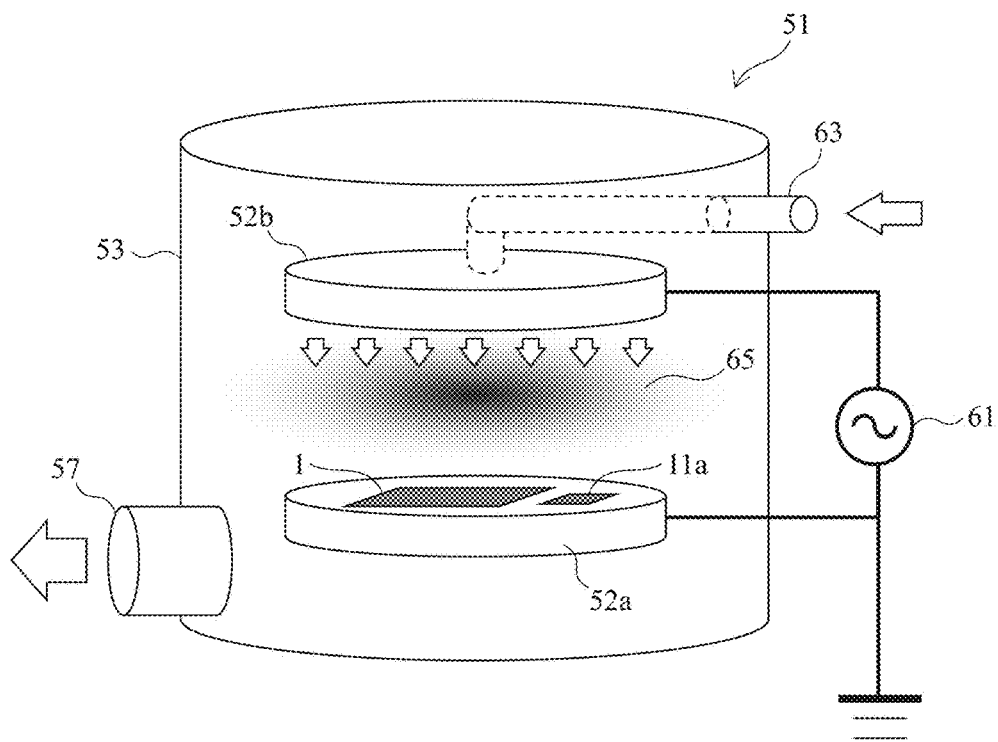
FIG. 8 is a view illustrating an exemplary structure of a plasma CVD system.

A method for producing a thin-film resistor in accordance with this embodiment will be described in detail with reference to FIGS. 1A to 7G. FIGS. 1A to 4I are cross-sectional views, and FIGS. 5A-1 to 7G are perspective views. FIG. 8 is a view illustrating an exemplary structure of a plasma CVD system for forming a protective film.

First, an insulating substrate 1 is loaded into a known sputtering system, and a resistive thin film 3 is deposited on the substrate 1 using a thin-film forming method (thin-film method) (FIGS. 1A, 5A-1, and 5A-2).

As the substrate 1, an inexpensive alumina substrate can be used, for example. The purity of the alumina substrate may be about 96%, for example, and the surface of the substrate 1 may have irregularities of about several microns (not shown).

As a sputtering target, a target containing silicon and also containing a desired amount of transition metal, such as chromium, therein is preferably used. For example, a target containing 70% silicon and 30% transition metal may be used. The resulting resistive thin film described below will have an equivalent composition of the components to that of the target excluding nitrogen added thereto. Examples of transition metal other than chromium include titanium, vanadium, manganese, iron, cobalt, nickel, zirconium, niobium, molybdenum, hafnium, tantalum, and tungsten. The transition metal serves as a conductive component in the resistive thin film.

As an atmosphere gas for sputtering, an inert gas, such as argon, and an adequate amount of nitriding gas, which contains a nitrogen element, are mixed so as to be used. Herein, a mixed gas of argon and nitrogen is used, for example, so that a nitride film, which results from nitridation of an adequate amount of the element contained in the target, is deposited on the substrate 1 so that the resistive thin film 3 is formed. For example, when a target containing silicon and also containing chromium as transition metal therein is used, the resulting resistive thin film will contain SiN and CrSi. CrSi serves as a conductive component in the resistive thin film. The resistive thin film can have electrical characteristics as a resistive element by containing silicon nitride as a main component and also containing transition metal therein. The method for forming the thin film is not limited to sputtering.

Figure 1A:
FIGS. 1A-1C are cross-sectional views illustrating an exemplary method for producing a thin-film resistor in accordance with the first embodiment of the present invention.
Figure 1B:
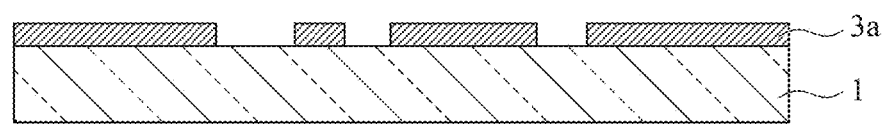
Figure 5B:
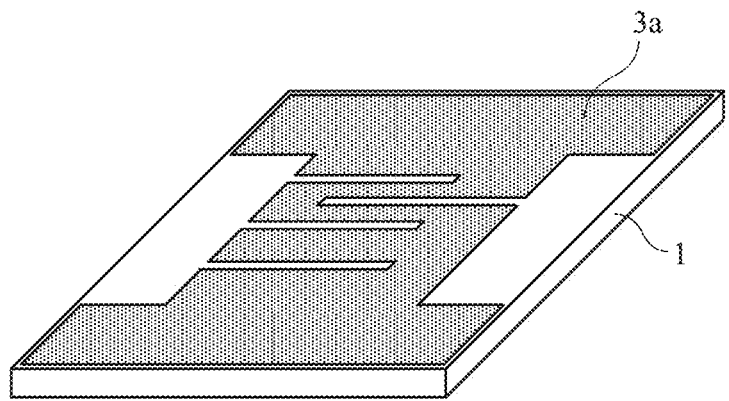

The thickness of the resistive thin film 3 deposited on the substrate 1 is about 50 to 150 nm, for example. The resistive thin film 3 is patterned using a photolithography technique, for example, so that after heat treatment is applied thereto in the next step, a thin-film resistive pattern 3a with an approximately desired resistance value can be obtained (FIGS. 1B and 5B).

Next, heat treatment is applied to the substrate 1 having the thin-film resistive pattern 3a formed thereon under an inert gas atmosphere, such as nitrogen or argon. The heat treatment temperature is preferably in the range of 500 to 800° C., for example. Through the heat treatment, the temperature coefficient of resistance (TCR) of the thin-film resistive pattern 3a can be adjusted so that it becomes close to zero. Specifically, adjustment is performed so that a temperature coefficient of resistance that is less than or equal to ±25 ppm/° C. is obtained, for example.

Next, base electrodes are formed. Base electrodes 5a, 5b are formed through deposition of copper, for example, using sputtering. The base electrodes 5a, 5b may be patterned using a metal mask arranged on the substrate 1 that has the thin-film resistive pattern 3a formed thereon, or be formed through a lift-off step using photoresist. Hereinafter, the latter case will be exemplarily described.

Photoresist is applied to the substrate 1 having the thin-film resistive pattern 3a formed thereon, and then the photoresist is patterned. After that, the surface of the thin-film resistive pattern 3a is sputter-etched by about several nm using argon ions, for example. This step is performed to remove a natural oxide film that has been formed on the surface of the resistive thin film in the heat treatment step and the like, and thus obtain a favorable electrical connection between the resistive thin film and the base electrodes.

Figure 1C:
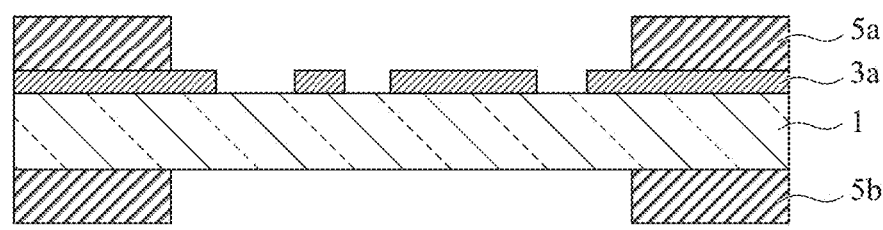

Copper, for example, is deposited as the base electrodes 5a on the sputter-etched thin-film resistive pattern 3a and the surface of the photoresist, using sputtering. The thickness of copper deposited herein is about 1 µm, for example. After that, the photoresist mask is removed using an organic solvent, such as a release agent, so that copper films are formed as the base electrodes 5a only in desired regions. It should be noted that the base electrodes 5b are also formed on the rear surface of the substrate in a similar manner to the base electrodes 5a (FIGS. 1C and 6C). In FIG. 6C, the base electrodes 5b are omitted.

Figure 2D:
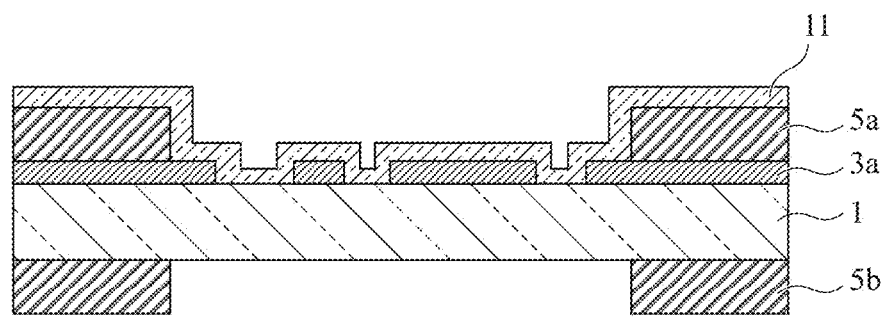
FIGS. 2D-2E are cross-sectional views illustrating an exemplary method for producing a thin-film resistor in accordance with the first embodiment of the present invention, continued from FIGS. 1A-1C.
Figure 6D:
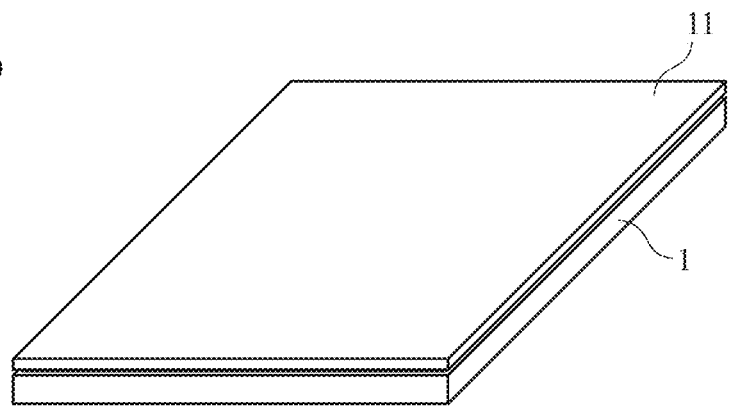

Next, a silicon nitride film 11 as a first protective film is deposited on the surface of the substrate 1 having formed thereon the thin-film resistive pattern 3a and the base electrodes 5a (FIGS. 2D and 6D). For depositing the silicon nitride film 11, a parallel-plate plasma CVD system is used (see FIG. 8), for example, and the film is formed at a substrate temperature of about 250 to 350° C. Examples of gases introduced into the plasma CVD system include $SiH_4$ gas, $NH_3$ gas, and $N_2$ gas. Changing the flow rate ratio between $SiH_4$ gas and $NH_3$ gas can change the refractive index of the silicon nitride film 11.

That is, increasing the ratio of the flow rate of $SiH_4$ gas to the total flow rate of $SiH_4$ gas and $NH_3$ gas: $SiH_4/(SiH_4+NH_3)$ can increase the refractive index of the silicon nitride film 11.

Changes in the refractive index of the silicon nitride film 11 due to the flow rate ratio of $SiH_4$ gas result from changes in the amount of silicon contained in the silicon nitride film.

FIG. 8 is a schematic view illustrating an exemplary structure of a plasma CVD system using parallel-plate RF discharge that can be used for forming protective films. A parallel-plate plasma CVD system 51 includes a chamber 53, a pair of parallel electrode plates 52a, 52b arranged in the chamber 53, an RF power supply 61 for applying RF voltage across the electrode plates, a vacuum evacuation unit (vacuum pump) 57 that evacuates the chamber 53 to vacuum, and a gas inlet portion 63 that introduces discharge gas. The substrate 1 to be processed can be loaded on the electrode plate 52a. Plasma CVD is a film formation technique with relatively good step coverage. Thus, this method is suitable for forming a protective film on a resistive thin film on a substrate that has large irregularities on its surface.

In the step of forming the silicon nitride film 11, $SiH_4$ and $NH_3$ or $N_2$ gas can be used as a source gas. A first protective film made of the silicon nitride film 11 has lower moisture permeability than a second protective film made of a silicon oxide film 12. Therefore, forming the first protective film 11 made of a silicon nitride film at a position below the second protective film 12 made of a silicon oxide film can suppress intrusion of moisture into the thin-film resistive pattern 3a from the outside in a high-temperature and high-humidity test described below.

As a source gas for forming the second protective film 12 made of a silicon oxide film, a mixed gas of $SiH_4$ and $N_2O$ gas can be used.

If the residual gas (in particular, oxygen, moisture, and the like) is left in a large amount within the RF discharge system, the influence of the gas will be large. Therefore, the pressure in the system is preferably set to a high vacuum at a pressure of less than or equal to about $10^{-4}$ Pa in a step of evacuating the system before the processing.

Figure 9:
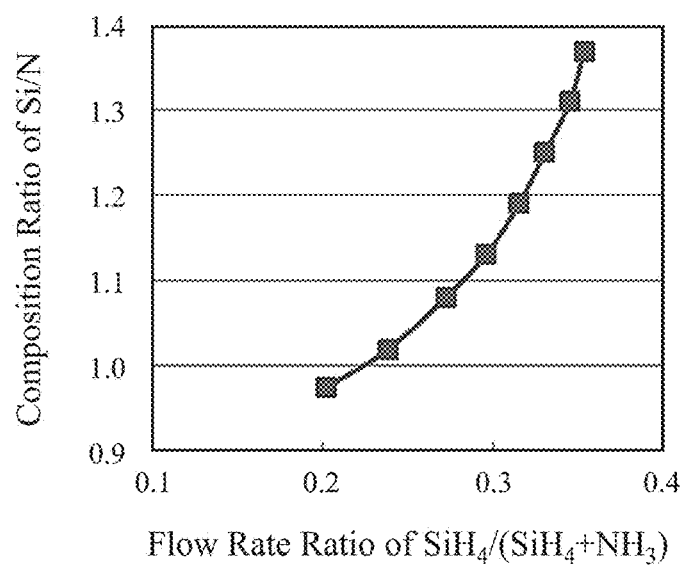
FIG. 9 is a chart illustrating the results of the analysis of the composition of a silicon nitride film produced in accordance with this embodiment.

FIG. 9 is a chart illustrating the results of the analysis of the composition of the produced silicon nitride film 11. The composition ratio of silicon in the $SiH_4$ film is increased with an increase in the flow rate ratio of the $SiH_4$ gas. In order to measure the thickness or the refractive index of the aforementioned silicon nitride film 11, a glass substrate or a silicon wafer is preferably loaded as a monitor substrate 11a into the plasma CVD system 51 so that a film is formed thereon at the same time as a film formed on the alumina substrate 1 (see FIG. 8).

Figure 2E:
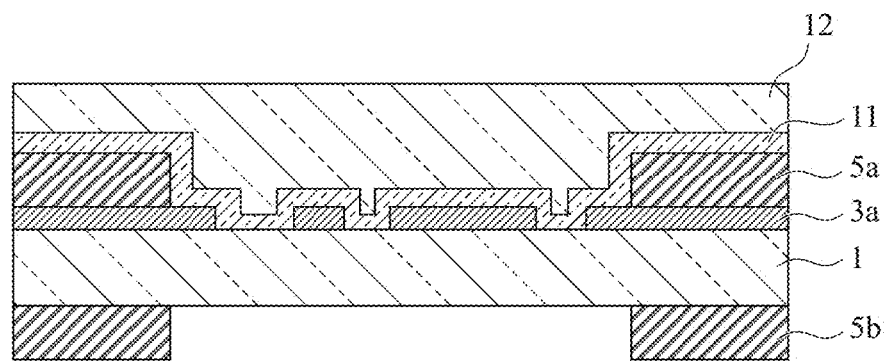
Figures 1, 6E:
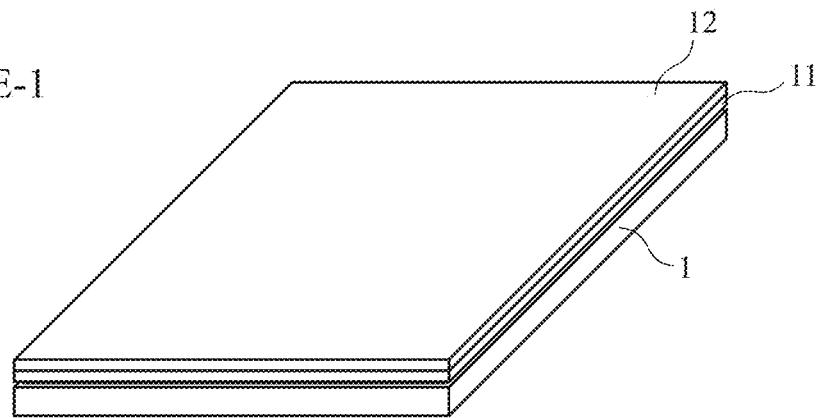

When glass or a silicon wafer having a flat surface is used as a substrate, the thickness and the refractive index of the silicon nitride film 11 formed thereon can be measured using an optical measuring device, such as a spectroscopic ellipsometer. According to experiments conducted by the inventor, it has been found that increasing the proportion of the flow rate of $SiH_4$ gas can increase the refractive index of the silicon nitride film 11. However, if the proportion of the flow rate of $SiH_4$ gas becomes greater than a certain level, the uniformity of the film-forming speed in the plasma CVD system 51 would decrease, which is thus unsuitable for production. According to the results of the study so far, production is preferably conducted under the condition that the resulting silicon nitride film 11 will have a refractive index of up to about 2.3. Next, the second protective film 12 made of a silicon oxide film is formed using the plasma CVD system 51 (FIGS. 2E and 6E-1). For depositing the second protective film 12 made of a silicon oxide film, the source gas is switched to $SiH_4$ gas and $N_2O$ gas.

Silicon oxide has a characteristic in having a high insulating property as it has a large band gap. In addition, silicon oxide has a role in preventing the diffusion and intrusion of metal elements from the outside.

The thickness of the second protective film 12 made of the silicon oxide film is preferably about 1 μm to 2 μm in order to cover the entire substrate surface having irregularities. In addition, from a viewpoint of protecting the resistive thin film of the thin-film resistive pattern 3a during laser trimming described below, the thickness of the second protective film 12 is set greater than at least the thickness of the first protective film 11 made of the silicon nitride film, desirably, double the thickness thereof. After that, the first protective film 11 and the second protective film 12 are patterned using a photolithography technique.

Figure 3F:
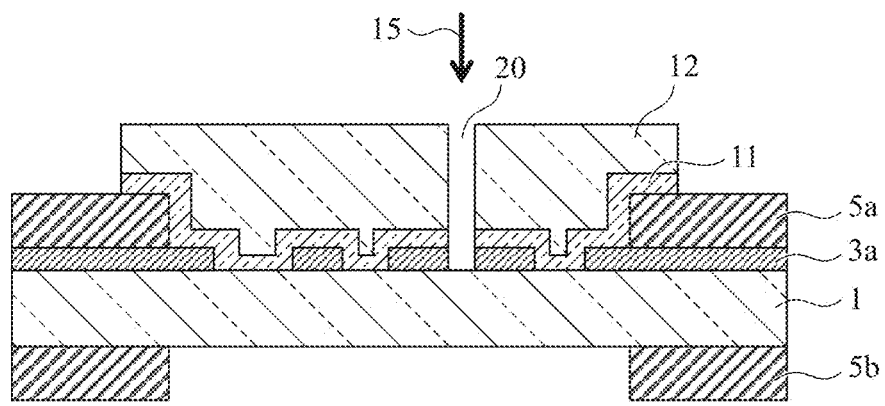
FIGS. 3F-3G are cross-sectional views illustrating an exemplary method for producing a thin-film resistor in accordance with the first embodiment of the present invention, continued from FIGS. 2D-2E.

Next, the resistive thin film of the thin-film resistive pattern 3a is irradiated with a laser beam 15 through the first protective film 11 and the second protective film 12 so that the resistive thin film of the thin-film resistive pattern 3a is trimmed to have a resistance value adjusted (FIG. 3F). An opening 20 is an opening formed through irradiation with the laser beam 15 (FIGS. 3F, 7E-2, and 7(f)). If the wavelength of the laser beam is relatively long (i.e., near infrared to infrared), the opening will be easily generated, while if the wavelength is short (i.e., visible to ultraviolet), the opening 20 formed will be small or will be hardly observed. Trimming is a process for adjusting the resistance value, and depends on at least one of the depth or the area of removing the resistive thin film of the thin-film resistive pattern 3a. In FIG. 3F, an example is illustrated in which the resistive thin film of the thin-film resistive pattern 3a in a predetermined region is removed up to the surface of the substrate 1 (see also FIG. 7F). The wavelength of the laser beam used is in the range of about 500 to 1100 nm. The refractive index of each layer preferably has the following magnitude relationship.

The refractive index of the second protective film<the refractive index of the first protective film<the refractive index of the resistive thin film (1)

The refractive index of the silicon oxide film that is the second protective film 12 is about 1.45 to 1.48 at the wavelength of the laser beam 15 for trimming. Meanwhile, the refractive index of the resistive thin film of the thin-film resistive pattern 3a in the same wavelength region is about 2.7 to 3.5. Thus, the refractive index of the silicon oxide film that is the first protective film 11 is desirably a value between such values as indicated by Formula (1). Further, the refractive index of the first protective film 11 is desirably a value around the square root of the product of the refractive index of the second protective film 12 and the refractive index of the resistive thin film.

In such a case, reflection of the irradiated laser beam 15 by each film interface is suppressed, and the incident laser beam 15 reaches the resistive thin film of the thin-film resistive pattern 3a most effectively, so that the resistive thin film can be processed. In addition, the proportion of changes in the transmissivity of the laser beam 15 to fluctuation of the refractive index of the first protective film 11 can be made relatively small.

Figure 10:
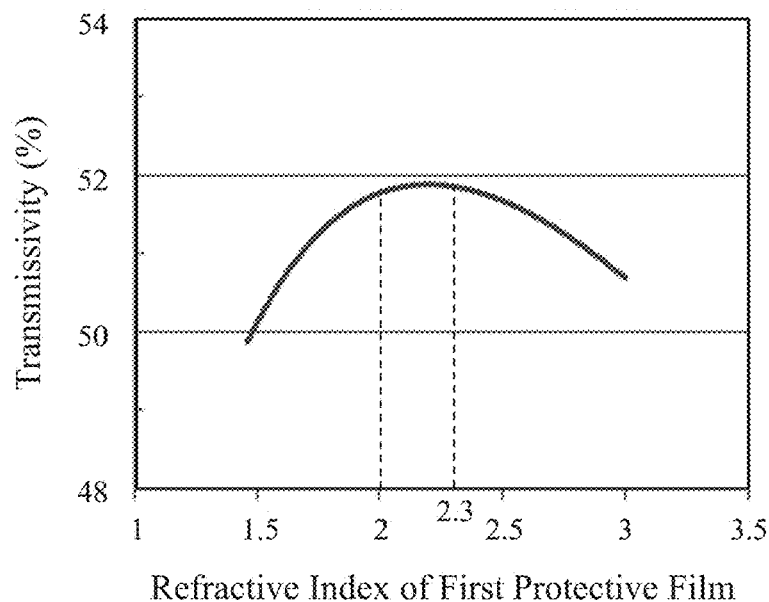
FIG. 10 is a chart illustrating exemplary computation of the transmissivity of an irradiated laser beam that has passed through a second protective film and a first protective film and reached a resistive thin film.

FIG. 10 is a chart illustrating exemplary computation of the transmissivity of the irradiated laser beam 15 that has passed through the second protective film 12 and the first protective film 11 and reached the resistive thin film of the thin-film resistive pattern 3a. It is found that when the refractive index of the first protective film 11 indicated on the abscissa axis of FIG. 10 is in the range of 2.0 to 2.3, fluctuation of the transmissivity is in the minimum range even if the transmissivity of the laser beam 15 in the aforementioned wavelength range is high and the refractive index of the first protective film 11 fluctuates. Thus, it is found that the refractive index of silicon nitride of the first protective film 11 that is in the range of 2.0 to 2.3 is suitable for the adjustment of the thin-film resistor.

Figure 3G:
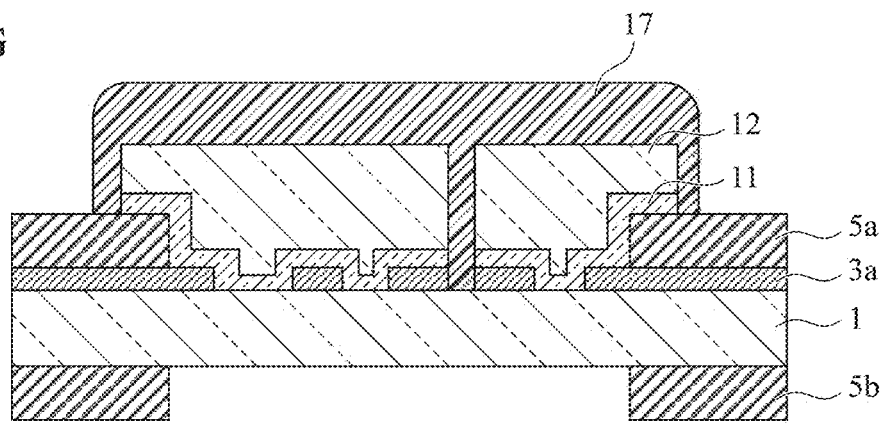

Following the laser trimming process, an overcoat film 17 is formed as illustrated in FIGS. 3G and 7G. The overcoat film 17 is a protective film made of resin, for example, and can be obtained by forming a pattern using screen printing or the like and curing it. The overcoat film 17 fills the opening 20 formed in part of a region of the resistive thin film of the thin-film resistive pattern 3a and in the first protective film 11 and the second protective film 12 above the part of the region.

Next, primary breaking is performed to divide the substrate 1 into strip-like chips. Then, end-face base electrodes 21 are formed on the exposed end faces of the substrate 1 (FIG. 4H). Then, secondary breaking is performed to obtain individual chips, and nickel and solder are applied to the end-face base electrodes 21 as well as to the base electrodes 5a, 5b on the upper and lower faces of the substrate 1, using electrolytic plating, so that electrode portions 25 are formed and a thin-film resistor is completed (FIG. 4I).

Figure 11:
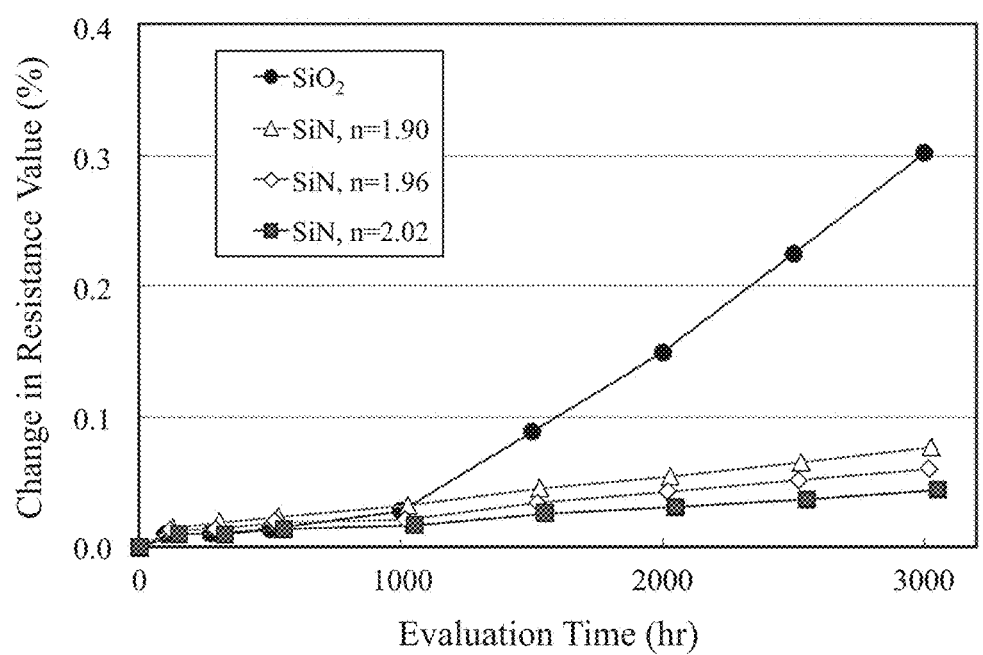
FIG. 11 is a chart illustrating a change in the resistance value of a thin-film resistor when an electrical current test was conducted thereon under a high-temperature and high-humidity environment for a long time.

FIG. 11 illustrates a change in the resistance value of the thus produced thin-film resistor when an electrical current test was conducted thereon under a high-temperature and high-humidity environment for a long time.

In FIG. 11, a sample that uses the first protective film 11 and the second protective film 12 (SiN in FIG. 11) and a sample that uses only the second protective film 12 (plots of $SiO_2$ in FIG. 11) are compared in terms of changes in the resistance values. It should be noted that a change in the resistance value on the ordinate axis indicates the percentage (%) of the change in the resistance value at a given time point relative to the initial resistance value before the test was started. The sample that uses only the second protective film 12 ($SiO_2$) is found to have a tendency that its resistance value starts to increase at around a time point of 1000 hours from the start of the current test.

Meanwhile, each sample having the first protective film 11 and the second protective film 12 sequentially stacked from the substrate 1 side (plots of SiN in FIG. 11) has a small increase rate of the resistance value. In particular, it is found that the greater the value of the refractive index (n) of the first protective film 11, the smaller the change in the resistance value.

Figure 12A:
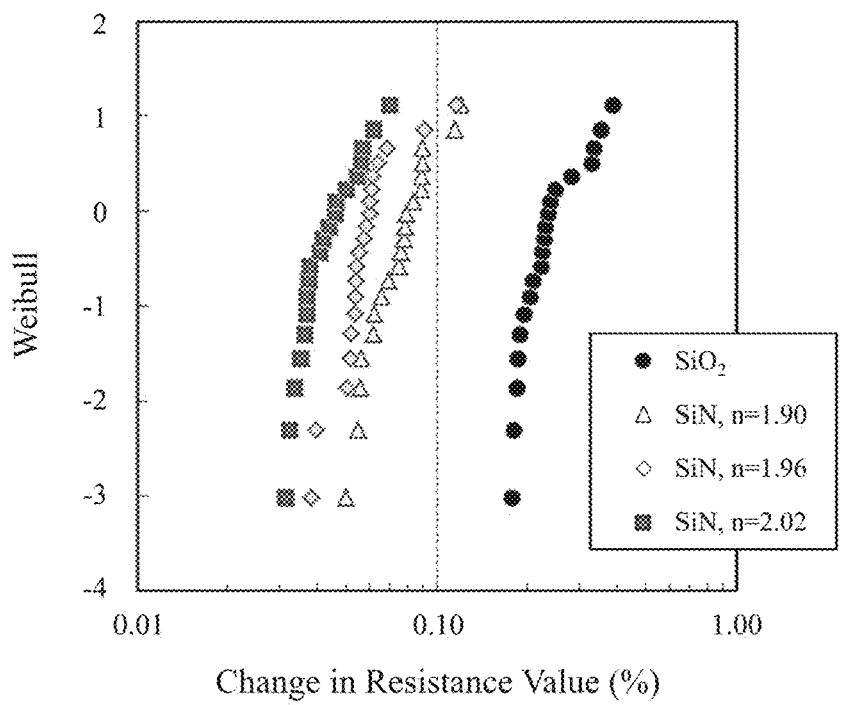
FIGS. 12A and 12B are charts illustrating variations of changes in the resistance value of a plurality of samples at a time point of 3000 hours from the start of an electrical current test; specifically.
Figure 12B:
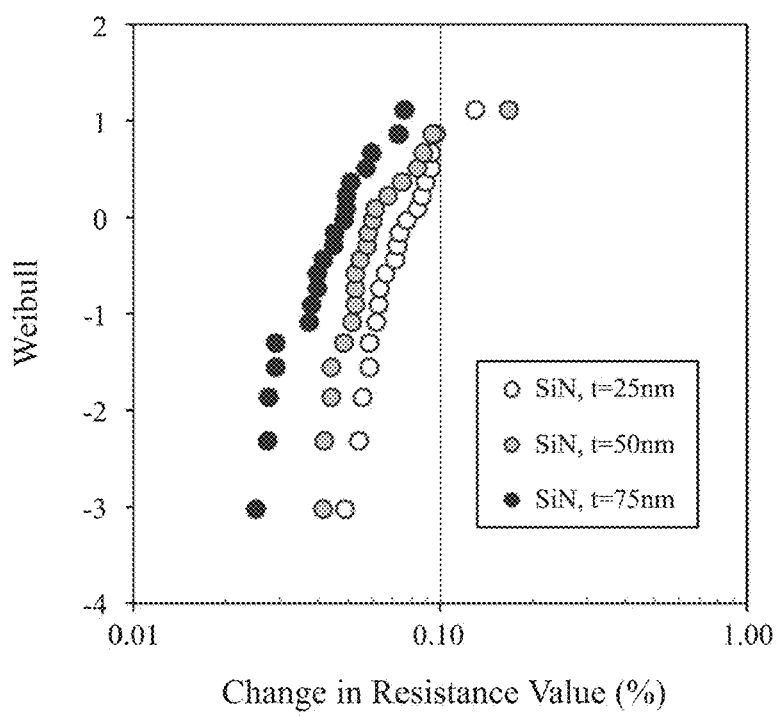

FIG. 12A is a chart illustrating variations of changes in the resistance value of a plurality of samples at a time point of 3000 hours from the start of the electrical current test. A change in the resistance value of each sample that uses only the second protective film 12 ($SiO_2$) is large, and variations among the samples are also large. Regarding each sample having the stacked first protective film 11 and second protective film 12 (SiN), it is found that the greater the refractive index (n) of the first protective film 11, the narrower the region in which changes in the resistance value are distributed. FIG. 12B illustrates the dependence on the thickness (t) of the first protective film 11. The greater the thickness, the smaller the changes in the resistance value. In particular, regarding samples with a thickness of 75 nm, all of the samples exhibited excellent characteristics such that the change rate of resistivity was less than 0.1%.

As described above, when the refractive index of the first protective film 11 is set to greater than or equal to 2.0 and the thickness thereof is set to greater than or equal to 75 nm, changes in the resistance value of the thin-film resistor under a high-temperature and high-humidity environment become small, and excellent moisture resistance is realized. A phenomenon that moisture resistance is enhanced with an increased refractive index of the first protective film 11 can be understood as follows.

The silicon nitride film that is the first protective film 11 is formed at a relatively low temperature using a method such as plasma CVD. This is because if the film is formed at a high temperature (for example, a temperature of greater than or equal to 400° C.), the electric properties of the resistive thin film of the thin-film resistive pattern 3a that has been already formed on the substrate 1 would change. A silicon nitride film that is formed at a film-forming temperature (substrate temperature) of less than or equal to 400° C., specifically, in the temperature range of about 250 to 350° C. is an approximately amorphous film, and contains many defects in its crystal structure, such as dangling bonds. Each of the silicon nitride film and the silicon oxide film formed as a protective film desirably has a dense film quality. The aforementioned temperature range is suitable because if the film is formed at a high temperature, the characteristics (in particular, the TCR characteristics) of the thin-film resistive material would change from its preset value.

Crystalline silicon nitride ($Si_3N_4$) has a dense crystal structure, and is unlikely to have moisture diffused therein as compared to silicon oxide ($SiO_2$). However, since the aforementioned silicon nitride film formed at a low temperature contains many crystal defects as well as "gaps" produced thereby, such a silicon nitride film is in a sparse state and thus it is speculated that water molecules will diffuse in the silicon nitride film relatively easily. Herein, if the amount of silicon in the silicon nitride film is increased, the crystal defects will be filled with the excessive amount of silicon, and water molecules will become difficult to diffuse in the film with an increase in the density of the film. That is, the silicon nitride film used herein preferably contains an excessive amount of silicon that is more than the amount corresponding to the stoichiometric composition Si:N=3:4, and accordingly, the value of the refractive index of the silicon nitride film is increased.

Figure 13:
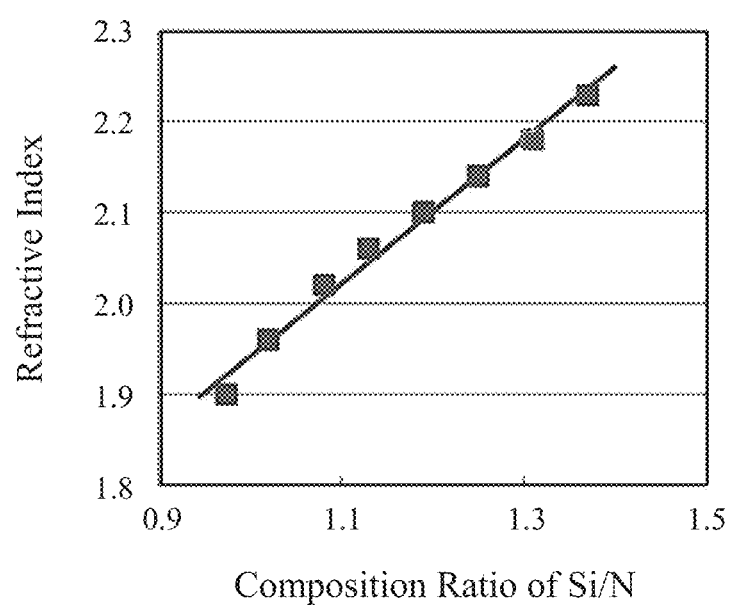

As described above, the moisture resistance (unlikeliness of having water molecules diffused in the film) of the silicon nitride film 11 formed at a low temperature can be enhanced with an excessive amount of silicon, and this corresponds to the refractive index of the film measured with an optical measurement method using an ellipsometer or the like (see FIG. 13).

Optical measurement using an ellipsometer or the like can be performed non-destructively in the atmosphere. Therefore, a film quality can be grasped with a device that is very simple and relatively inexpensive. Thus, a process of also using an ellipsometer is preferred. In this example, the refractive index was measured with a laser beam with a wavelength of 632.8 nm.

It should be noted that a method of grasping the amount of silicon contained in a film using a photoelectronic spectrometer (XPS) or the like is difficult to apply for controlling quality at a production site since the photoelectronic spectrometer is expensive and the method involves the operation of preparing measurement samples as small pieces and loading them into a vacuum chamber, for example.

If the amount of silicon in the silicon nitride film is further increased, the refractive index of the film is further increased and tends to approach the refractive index of silicon (3.4 to 3.5). At the same time, the film changes into an absorptive opaque film. Considering the reflection and absorption of a laser beam in the laser trimming step, such a film is unsuitable as a protective film.

In the silicon nitride film, if the amount of silicon not bound to nitrogen is increased, a defect level is formed in the band gap of the silicon nitride film, which then becomes a conductive path and thus lowers the insulating property of the film. Such a film is also unsuitable as a protective film.

As described above, considering the film deposition uniformity in the plasma CVD system 51 as well, deposition is preferably performed under the condition that the silicon nitride film 11 will have a refractive index of about up to 2.0 to 2.3 at a wavelength of 632.8 nm. With such a condition, excellent moisture resistance of the thin-film resistor can be ensured, and also, generation of problems, such as failures in laser trimming and a decrease in the insulating property, can be prevented.

Setting the thickness of the silicon nitride film, which is the first protective film 11, to greater than or equal to 75 nm can obtain excellent moisture resistance. This is considered to be due to the fact that since the alumina substrate 1 used for the thin-film resistor has irregularities on its surface, a certain film thickness would be needed to ensure certain coverage of the substrate with the film and that since the protective film is approximately amorphous as described above, diffusion of water molecules in the protective film would not be completely suppressed unless the film has a certain thickness.

Thus, a certain film thickness would be needed. If the thickness of the silicon nitride film 11 is set to greater than 75 nm, the effect of suppressing the diffusion and intrusion of water into the resistive thin film of the thin-film resistive pattern 3a from the outside of the thin-film resistor is further enhanced. However, since the first protective film 11 made of the silicon nitride film is a film that contains an excessive amount of silicon as described above, the first protective film 11 made of the silicon nitride film has internal stress. Accordingly, if the film thickness is too large, the alumina substrate 1 would be distorted due to the internal stress, which will influence the electrical characteristics of the resistive thin film of the thin-film resistive pattern 3a.

In addition, from a viewpoint of protecting the resistive thin film of the thin-film resistive pattern 3a in the laser trimming step, the thickness of the first protective film 11 made of the silicon nitride film is desirably less than or equal to ½ the thickness of the second protective film 12 made of the silicon oxide film. For covering the entire substrate surface with irregularities, the second protective film 12 made of the silicon oxide film preferably has a thickness of about 1 to 2 μm. Therefore, the thickness of the first protective film 11 made of the silicon nitride film may be less than or equal to 500 nm.

With the thickness in the aforementioned range, excellent moisture resistance of the thin-film resistor can be ensured, and thus problems, such as fluctuation of the electrical characteristics due to film stress and the like, will not occur.

It should be noted that verification was also performed on a case where a silicon oxide film and a silicon nitride film were sequentially deposited as the first protective film 11 and the second protective film 12, respectively, on the resistive thin film of the thin-film resistive pattern 3a. As a result of conducting a reliability test on the thin-film resistor with the layers stacked in a reverse order from the substrate side under a high-temperature and high-humidity environment, relatively large fluctuation of the resistance value was confirmed. That is, the magnitude relationship of the fluctuations of the resistance values due to the difference in the stacked structure of the protective films is as follows. It is assumed that a layer in contact with the resistive thin film (the first protective film) is a lower layer, and a layer stacked thereon (the second protective film) is an upper layer (the lower layer: a silicon nitride film, the upper layer: a silicon oxide film)<(the lower layer: a silicon oxide film, the upper layer: a silicon nitride film)<(only a silicon oxide film).

As the structure of the protective films for the thin-film resistive material, which contains silicon nitride as a main component, it has been found that a structure is suitable that is formed by depositing a silicon nitride film as the first protective film 11 such that it is in contact with the resistive thin film of the thin-film resistive pattern 3a and covers the entire surface thereof, and then depositing a silicon oxide film as the second protective film 12.

It should be noted that if the silicon nitride film 11 and the silicon oxide film 12 are formed under the condition of the same substrate temperature, the silicon nitride film 11 and the silicon oxide film 12 can be successively formed only by switching the gas introduced into the plasma CVD system 51. Thus, throughput in the formation the protective films can be enhanced.

Second Embodiment

Figure 14A:
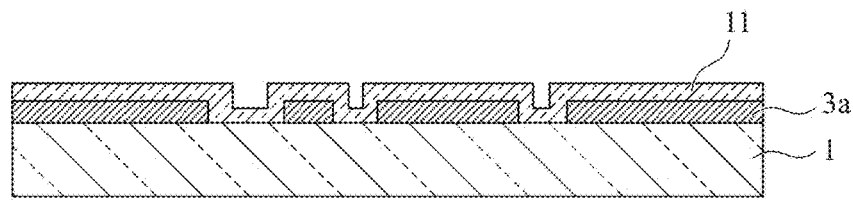
FIGS. 14A-14E are cross-sectional views illustrating an exemplary method for producing a thin-film resistor in accordance with the second embodiment of the present invention.
Figure 14B:
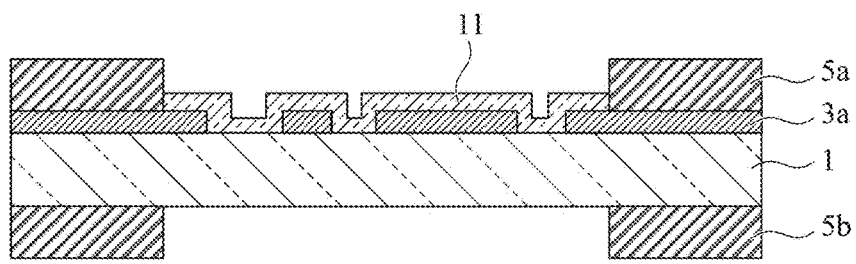
Figure 14C:
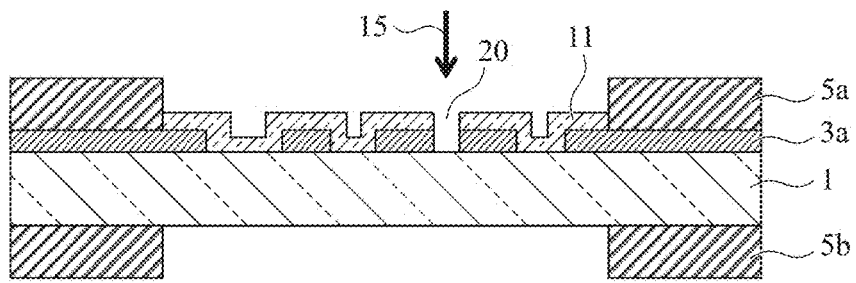
Figure 14D:
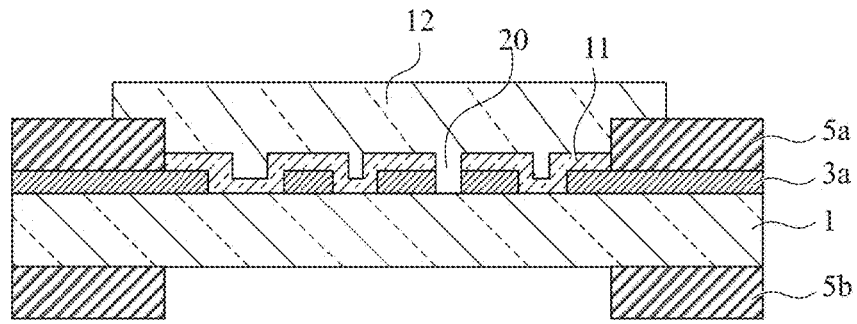
Figure 14E:
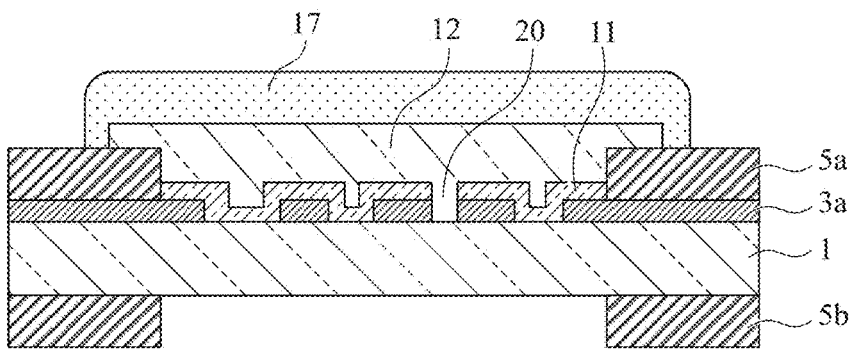

The step of forming the first protective film 11 in the first embodiment may be performed after heat treatment is applied to the thin-film resistive pattern 3a illustrated in FIG. 1B (before the base electrodes 5a are formed) (FIG. 14A). In this case, in a step of removing a natural oxide film on the surface of the resistive thin film of the thin-film resistive pattern 3a using ion etching before forming the base electrodes 5a, 5b, the first protective film 11 is removed, and the base electrodes 5a, 5b are formed (FIG. 14B). After that, through steps similar to those in FIGS. 2E and 3F, trimming is performed using the laser beam 15 so as to adjust the resistance value (FIG. 14C). After that, the second protective film 12 is stacked and is then patterned so as to expose portions of the base electrodes 5a. In this embodiment, the laser-trimmed portion 20 is filled with the second protective film 12 (FIG. 14D). Therefore, changes in the resistance value of the resistive film 3a can be suitably suppressed. After that, the overcoat film 17 is formed covering the second protective film 12, using screen printing (FIG. 14E). The overcoat film 17 is formed above the laser-trimmed portion (opening) 20 formed in the thin-film resistance 3a. After that, end-face electrodes are formed and plating films of Ni and Sn are formed, as described above.

In this embodiment, the effect of suppressing fluctuation of the resistance value of the thin-film resistor was also confirmed as a result of conducting a reliability test on the resistor under a high-temperature and high-humidity environment as in the first embodiment.

Third Embodiment

Figure 15A:
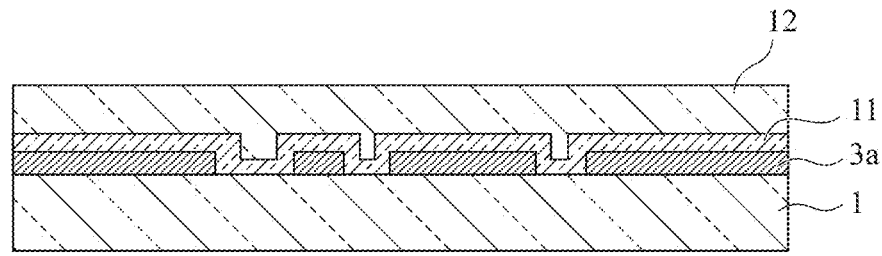
FIGS. 15A-15D are cross-sectional views illustrating an exemplary method for producing a thin-film resistor in accordance with the third embodiment of the present invention.
Figure 15B:
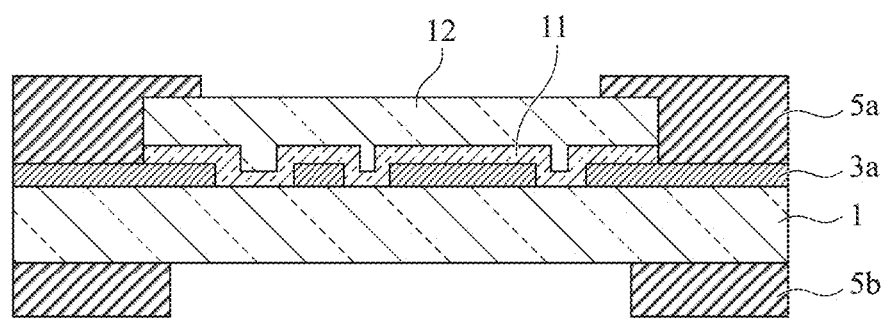

The steps of up to forming the first protective film 11 and the second protective film 12 may be performed after heat treatment is applied to the resistive thin film of the thin-film resistive pattern 3a (FIG. 15A). In such a case, as in FIG. 1F of the first embodiment, the first protective film 11 and the second protective film 12 are partially patterned so that openings are formed and the base electrodes 5a, 5b are formed therein (FIG. 15B).

Figure 15C:
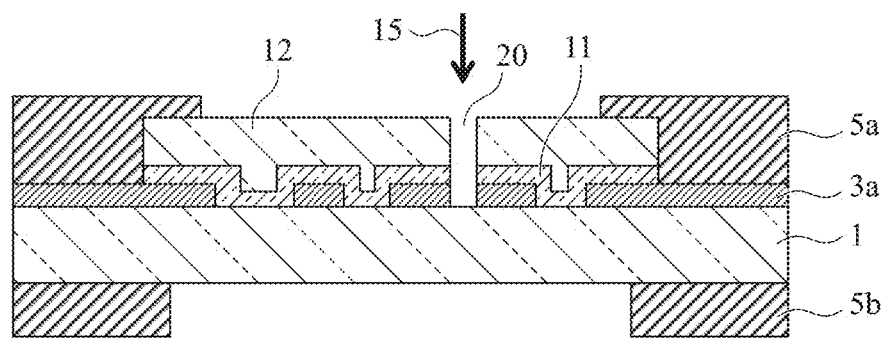

After that, laser trimming (15) is performed through similar steps to those in FIGS. 2E and 3F so as to adjust the resistance value (FIG. 15C).

Figure 15D:
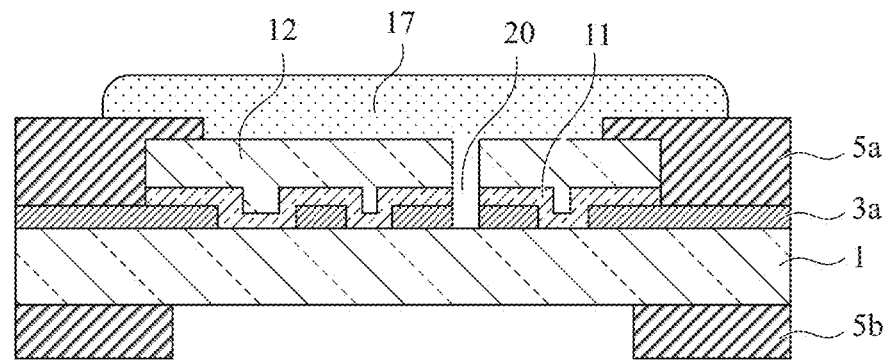

Accordingly, excellent electrical characteristics can be ensured between the resistive thin film of the thin-film resistive pattern 3a and the base electrodes 5a, and a structure can be realized in which the resistive thin film of the thin-film resistive pattern 3a is covered with the first protective film 11. In this example, the end faces of the first protective film 11 and the second protective film 12 as well as regions above them are covered with Cu (5a) that is an inorganic material. Therefore, there is an advantage in that a moisture permeation phenomenon is unlikely to occur. After that, the overcoat film 17 is formed between the electrodes 5a (FIG. 15D). Then, end-face electrodes are formed and plating films of Ni and Sn are formed, as described above.

In this embodiment, the effect of suppressing fluctuation of the resistance value of the thin-film resistor was also confirmed as a result of conducting a reliability test on the resistor under a high-temperature and high-humidity environment as in the first and second embodiments.

It should be noted that the first and second protective films may be deposited using a method other than plasma CVD, typically, sputtering, for example.

In the aforementioned embodiments, the configurations and the like that are illustrated in the accompanying drawings are not limited thereto, and can be changed as appropriate within the range that the advantageous effects of the present invention are exerted. Besides, the configurations and the like can be changed as appropriate within the spirit and scope of the present invention.

Further, each constituent element of the present invention can be selected or not selected as appropriate, and an invention that has the selected elements is encompassed by the present invention.

INDUSTRIAL APPLICABILITY

The present invention is applicable to chip resistors.

All publications, patents, and patent applications that are cited in this specification are all incorporated by reference into this specification.

What is claimed is:
1. A thin-film chip resistor comprising:
an insulating substrate;
a thin-film resistive element formed on the substrate;
a pair of electrodes connected to the thin-film resistive element; and
a protective film covering at least the thin-film resistive element between the pair of electrodes,
wherein:
the protective film includes a first protective film and a second protective film, the first protective film contain- ing silicon nitride in contact with the thin-film resistive element, and the second protective film containing silicon oxide in contact with the first protective film.

2. The thin-film chip resistor according to claim 1, wherein a refractive index of the first protective film is 2.0 to 2.3 at a wavelength of 632.8 nm.

3. The thin-film chip resistor according to claim 1, wherein the first protective film contains an excessive amount of silicon, the amount being greater than an amount corresponding to a stoichiometric composition of silicon nitride Si:N=3:4.

4. The thin-film chip resistor according to claim 1, wherein the second protective film is thicker than the first protective film.

5. The thin-film chip resistor according to claim 1, wherein a thickness of the first protective film is 75 to 500 nm.

6. The thin-film chip resistor according to claim 1, further comprising an overcoat film covering a region between the pair of electrodes, wherein:

the overcoat film is formed covering an opening that is formed in part of the thin-film resistive element.

7. A method for producing a thin-film chip resistor, comprising:

preparing an insulating substrate;

forming, on the substrate, a thin-film resistive element and a pair of electrodes connected to the thin-film resistive element, and forming a first protective film containing silicon nitride, the first protective film covering the thin-film resistive element between the pair of electrodes; and forming a second protective film containing silicon oxide, the second protective covering the first protective film.

8. The method for producing a thin-film chip resistor according to claim 7, further comprising:

after forming the second protective film, forming an opening by removing part of a region of the thin-film resistive element and at least part of the first protective film and the second protective film that are formed above the part of the region.

* * * * *